United States Patent
Wu et al.

(10) Patent No.: US 10,291,239 B1
(45) Date of Patent: May 14, 2019

(54) DELTA-SIGMA MODULATOR HAVING EXPANDED FRACTIONAL INPUT RANGE

(71) Applicant: Xilinx, Inc., San Jose, CA (US)

(72) Inventors: Zhaoyin D. Wu, San Jose, CA (US); Winson Lin, San Francisco, CA (US); Parag Upadhyaya, Los Gatos, CA (US); Geoffrey Zhang, San Jose, CA (US); Kun-Yung Chang, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/000,698

(22) Filed: Jun. 5, 2018

(51) Int. Cl.
*H03L 7/08* (2006.01)
*H03L 7/197* (2006.01)

(52) U.S. Cl.
CPC .......... *H03L 7/0805* (2013.01); *H03L 7/1974* (2013.01)

(58) Field of Classification Search
CPC ... H03L 7/0805; H03L 7/0807; H03L 7/0992; H03L 7/1974; H03L 7/1976
USPC .......................... 327/117, 147, 150, 156, 159
See application file for complete search history.

(56) References Cited

U.S. PATENT DOCUMENTS

| | | | |
|---|---|---|---|
| 6,600,788 B1 | 7/2003 | Dick et al. | |
| 6,876,698 B1 | 4/2005 | Dick et al. | |
| 9,007,248 B2* | 4/2015 | Oishi | H03M 7/3022 341/143 |
| 9,559,704 B1 | 1/2017 | Wong et al. | |
| 2007/0008040 A1* | 1/2007 | Mayer | H03K 23/667 331/1 A |
| 2009/0079605 A1* | 3/2009 | Chang | H03L 7/1976 341/143 |

* cited by examiner

*Primary Examiner* — William Hernandez
(74) *Attorney, Agent, or Firm* — Robert M. Brush (57) ABSTRACT

An example apparatus includes an input circuit including a first adder and a first multiplier, the first adder configured to level-shift an input signal by an amount and the first multiplier configured to multiply output of the adder by a factor. The apparatus further includes a multi-stage noise shaping (MASH) circuit having an input coupled to the first multiplier. The apparatus further includes an output circuit including a second multiplier and a second adder, the second multiplier configured to multiply output of the MASH circuit by a reciprocal of the factor and the second adder configured to level-shift output of the second multiplier by an inverse of the amount.

20 Claims, 9 Drawing Sheets

DELTA-SIGMA MODULATOR HAVING EXPANDED FRACTIONAL INPUT RANGE

TECHNICAL FIELD

Examples of the present disclosure generally relate to electronic circuits and, in particular, to a delta-sigma modulator (DSM) having an expanded fractional input range.

BACKGROUND

High-speed data communication systems frequently rely on dock and data recovery (CDR) circuits within the receiver rather than transmitting a reference clock with the data. For example, serial data communication may include the use of a serializer-deserializer (SERDES) at each end of a communication link. Within a SERDES, a CDR may extract a clock that is embedded in the incoming data stream. Once a dock is recovered, the clock is used to sample the incoming data stream to recover individual bits.

A CDR can make use of a fractional-N phase locked loop (PLL) for generating clock signals. The fractional-N PLL includes a divider for dividing the output clock and comparing the divided output dock to a reference clock. A fractional-N PLL can include a delta-sigma modulator (DSM) having a multi-stage noise shaping (MASH) circuit for generating a dithered divider signal. The fractional-N PLL uses a frequency divider to provide the integer part of the divider and the DSM to provide a fractional part of the divider. Conventional MASH 1-1 and 1-1-1 architectures can only handle fractional input ranged from 0 to 1-LSB (where LSB is the value represented by the least significant bit of the input). For example, a fractional-N PLL can implement a divider of 50.01 using an integer divider of 50 and a fractional divider of 0.01. If the divider is changed to 49.99, the integer divider can be changed from 50 to 49 without complication. However, the DSM output must travel from 0.01 to 0.99 (almost the full range), which increases the time needed to change the divider from 50 to 49.99 despite the change being only one LSB. Accordingly, there is a need for a more flexible DSM architecture that can handle expanded input ranges centered around an integer.

SUMMARY

Techniques for providing a delta-sigma modulator (DSM) having an expanded fractional input range are described. In an example, an apparatus includes: an input circuit including a first adder and a first multiplier, the first adder configured to level-shift an input signal by an amount and the first multiplier configured to multiply output of the adder by a factor; a multi-stage noise shaping (MASH) circuit having an input coupled to the first multiplier; and a output circuit including a second multiplier and a second adder, the second multiplier configured to multiply output of the MASH circuit by a reciprocal of the factor and the second adder configured to level-shift output of the second multiplier by an inverse of the amount.

In another example, an apparatus includes: an input circuit including a first adder and a first multiplier, the first adder configured to level-shift an input signal by an amount and the first multiplier configured to multiply output of the adder by a factor; a plurality of multi-stage noise shaping (MASH) circuits each having an input coupled to the first multiplier; and an output circuit having a second adder, the second adder configured to level-shift a combined output of the plurality of MASH circuits by an inverse of the amount.

In another example, a method of operating a delta-sigma modulator (DSM) includes: level-shifting, by a first adder in an input circuit, an input signal by an amount; scaling, by a first multiplier in the input circuit, output of the first adder by a factor; filtering output of the first multiplier through a multi-stage noise shaping (MASH) circuit; scaling, by a second multiplier in an output circuit, output of the MASH circuit by a reciprocal of the factor; and level-shifting, by a second adder in the output circuit, output of the second multiplier by an inverse of the amount.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a delta-sigma modulator (DSM) having an expanded fractional input range are described. In particular, techniques described herein expand the capability of a DSM multi-stage noise shaping (MASH) 1-1 or 1-1-1 structure in terms of its fractional input ranged from −N to N-LSB, where LSB is $\frac{1}{2}^{accumulator\_size}$, where accumulator_size is the bitwidth of the accumulators in the MASH circuit. In an example, the DSM includes an input circuit, a MASH circuit, and an output circuit. The input circuit is configured to level-shift and scale a fractional input ranged from −N to N-LSB to provide an input to the MASH circuit ranged between 0 and 1-LSB. The output circuit is configured to scale and level-shift the output of the MASH circuit inversely to the scaling and level-shifting implemented by the input circuit. This allows the DSM to have an expanded fractional input range, while still implementing a MASH circuit with an input ranged between 0 and 1-LSB. These and further aspects are described below with respect to the drawings.

Figure 1:
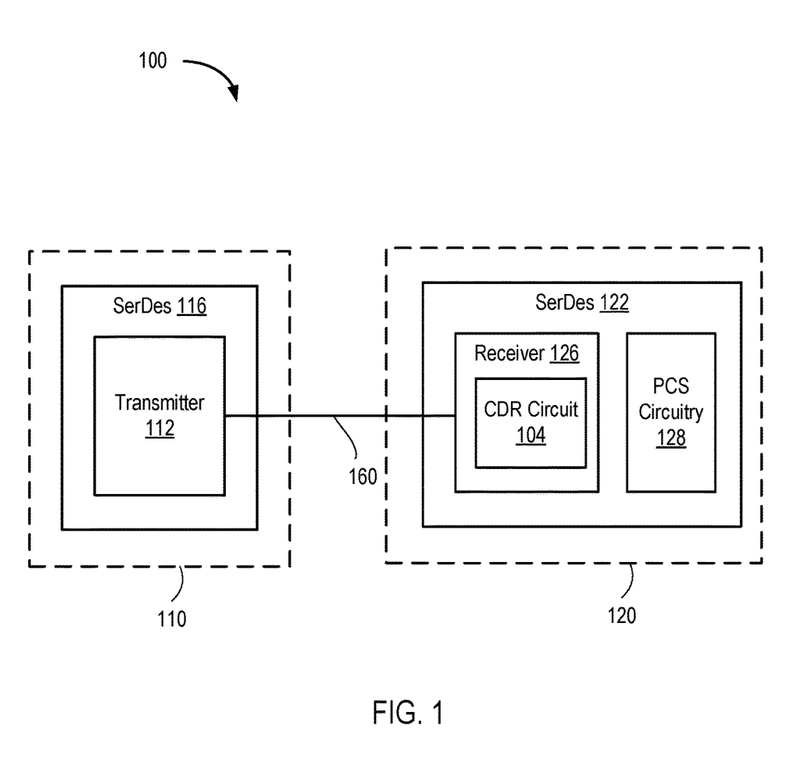
FIG. 1 is a block diagram depicting an example of a serial communication system according to an example.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SerDes) 116. The receiver 126 can be part of a SerDes 122. The transmission medium 160 comprises an electrical path between the transmitter 112 and the receiver 126 and can include printed circuit board (PCB) traces, vias, cables, connectors, decoupling capacitors, and the like. The receiver of the SerDes 116, and the transmitter of the SerDes 122, are omitted for clarity. In some examples, the SerDes 116 can be disposed in an integrated circuit (IC) 110, and the SerDes 122 can be disposed in an IC 120.

The transmitter 112 drives serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In some examples, the transmitter 112 uses a binary non-return-to-zero (NRZ) modulation scheme. In binary NRZ, a symbol is one bit of the serial data and two analog voltages are used to represent each bit. In other examples, the transmitter uses multi-level digital baseband modulation techniques, such as pulse amplitude modulation (PAM), where a symbol includes a plurality of bits of the serial data and more than two analog voltages are used to represent each bit.

The receiver 126 generally includes a clock and data recovery (CDR) circuit 104. An example structure of the receiver 126 is described further below with respect to FIG. 2. The receiver 126 receives an analog signal from the transmission medium 160. The CDR circuit 104 operates to recover data and a clock from the analog signal. The receiver 126 provides the recovered data to physical coding sublayer (PCS) circuitry 128 in SerDes 122 for decoding and further processing.

Figure 2:
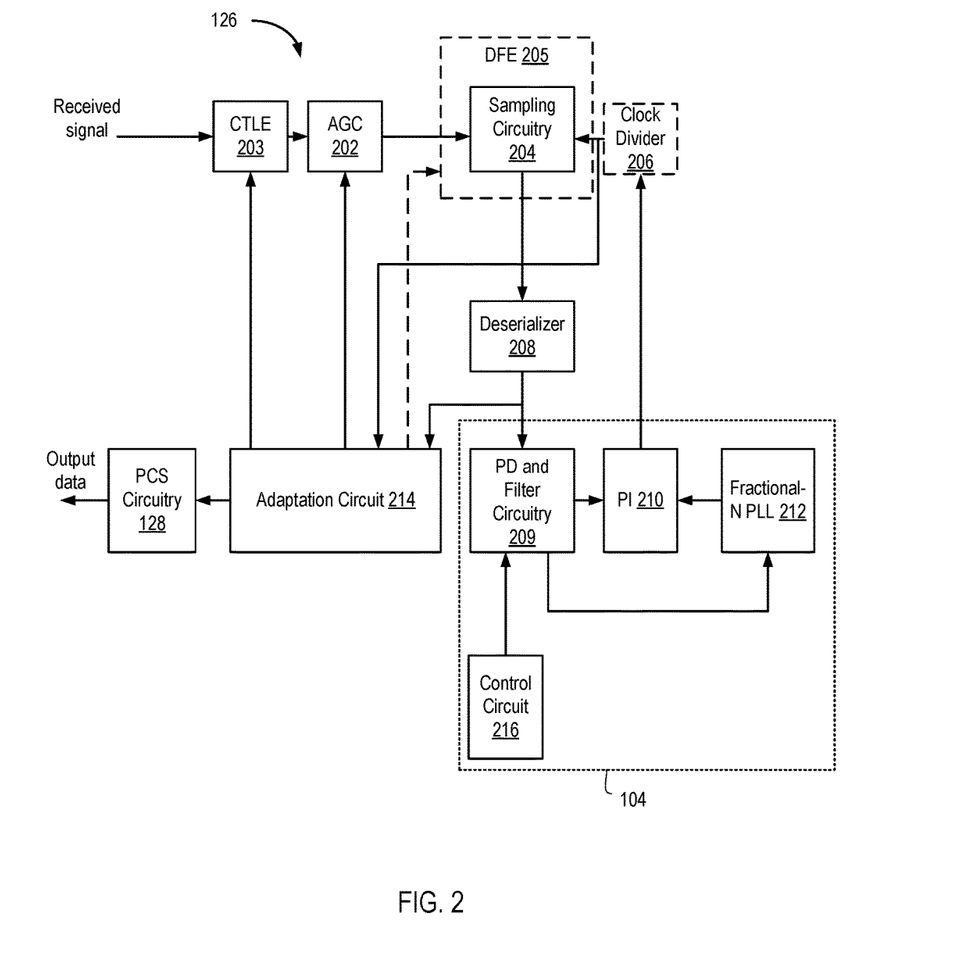
FIG. 2 is a block diagram depicting the receiver according to an example.

FIG. 2 is a block diagram depicting the receiver 126 according to an example. The receiver 126 includes a continuous time linear equalizer (CTLE) 203, an automatic gain control (AGC) circuit 202, sampling circuitry 204, deserializer 208, the CDR circuit 104, and an adaptation circuit 214. The CDR circuit 104 includes phase detector (PD) and filter circuitry 209, a phase interpolator (PI) 210, a fractional-N phase locked loop (PLL) 212, and a control circuit 216.

An output of the CTLE 203 is coupled to an input of the AGC circuit 202. An output of the AGC circuit 202 is coupled to inputs of the sampling circuitry 204. An output of the clock divider 206 is coupled to inputs of the sampling circuitry 204. An output the sampling circuitry 204 is coupled to an input of the deserializer 208. An output of the deserializer 208 is coupled to an input of the PD and filter circuitry 209. Outputs of the PD and filter circuitry 209 are coupled to an input of the adaptation circuit 214, an input of the PI 210, and an input of the fractional-N PLL 212, respectively. Another input of the PI 210 is coupled to an output of the fractional-N PLL 212. In an example, an output of the PI 210 is coupled to an input of the sampling circuitry 204. In another example, the output of the PI 210 is coupled to an input of a clock divider 206, and an output of the clock divider 206 is coupled to an input of the sampling circuitry 204. Outputs of the adaptation circuit 214 are coupled to the CTLE 203, the AGC circuit 202, and the PCS circuitry 128, respectively. In an example, the sampling circuitry 204 can be part of a decision feedback equalizer (DFE) 205. In such case, another output of the adaptation circuit 214 is coupled to the DFE 205.

In operation, the CTLE 203 receives an analog signal from the transmission medium 160. The CTLE 203 operates as a high-pass filter to compensate for the low-pass characteristics of the transmission medium 160. The peak of the frequency response of the CTLE 203 can be adjusted based on a CTLE adjust signal provided by the adaptation circuit 214. The AGC circuit 202 receives the equalized analog signal from the CTLE 203. The AGC circuit 202 adjusts the gain of the equalized signal based on a gain adjust signal provided by the adaptation circuit 214. In another example, the AGC circuit 202 can precede the CTLE circuit 203.

The sampling circuitry 204 generates data, error, and crossing samples from the output of the AGC circuit 202 based on a sampling clock signal supplied by the PI 210. The sampling circuitry 204 can generate the data samples using a data sampling clock and the crossing samples using a crossing sampling clock, where the crossing sampling clock is shifted in phase from the data sampling clock by 90 degrees. The sampling circuitry 204 can generate both the data and crossing sampling clocks from the sampling clock signal supplied by the PI 210 (e.g., using a 90 degree phase shifter). Alternatively, the PI 210 can supply a sampling clock signal that includes the data, error, and crossing sampling clocks. In another example, the clock divider 206 can generate the data and crossing sampling clocks from the sampling clock signal supplied by the PI 210. The clock divider 206, if present, can also reduce the frequency of the sampling clock signal supplied by the PI 210. In example, the sampling circuitry 204 is part of the DFE 205. The DFE 205 equalizes the output of the AGC circuit 202 to minimize inter-symbol interference (ISI).

Each data and crossing sample includes one or more bits depending on the type of modulation scheme employed (e.g., one bit samples for binary NRZ and multi-bit samples for PAM). The deserializer 208 groups data samples and crossing samples to generate a deserialized signal. The deserializer 208 unifies the two separate parallel data and crossing sample streams into a deserialized signal to be processed by the PD and filter circuitry 209.

Figure 3:
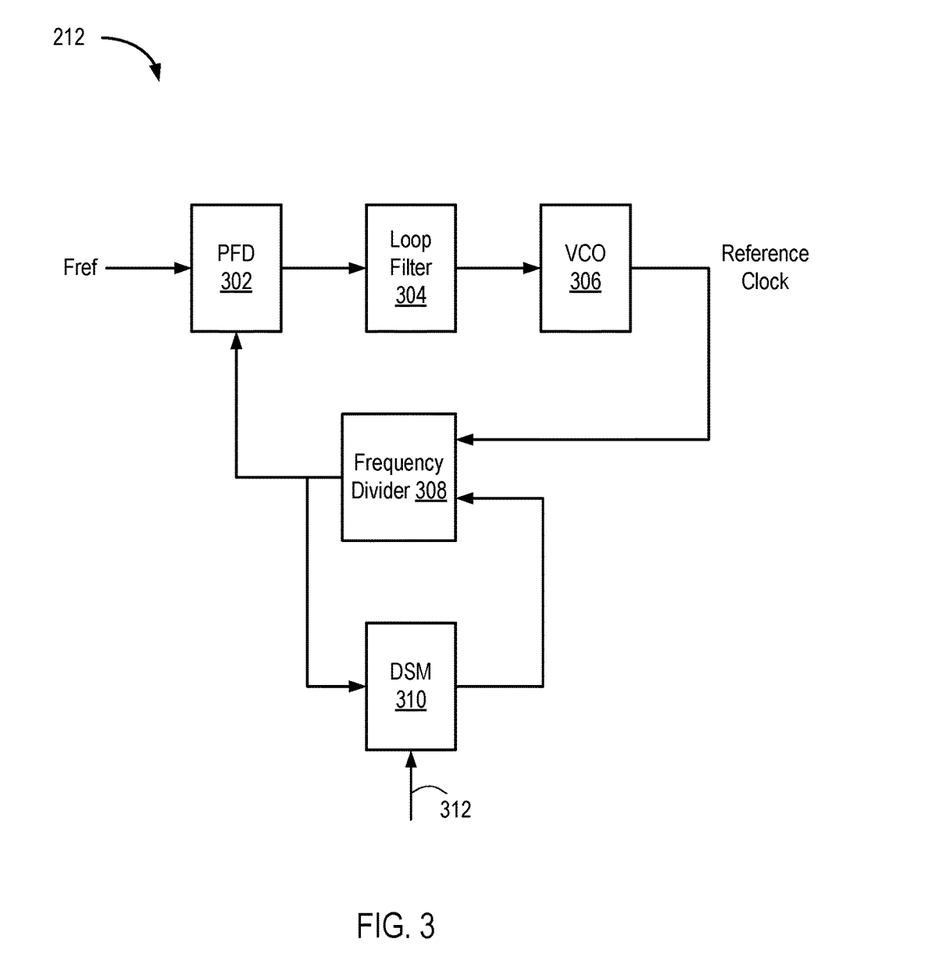
FIG. 3 is a block diagram depicting the fractional-N phase locked loop (PLL) according to an example.
Figure 4:
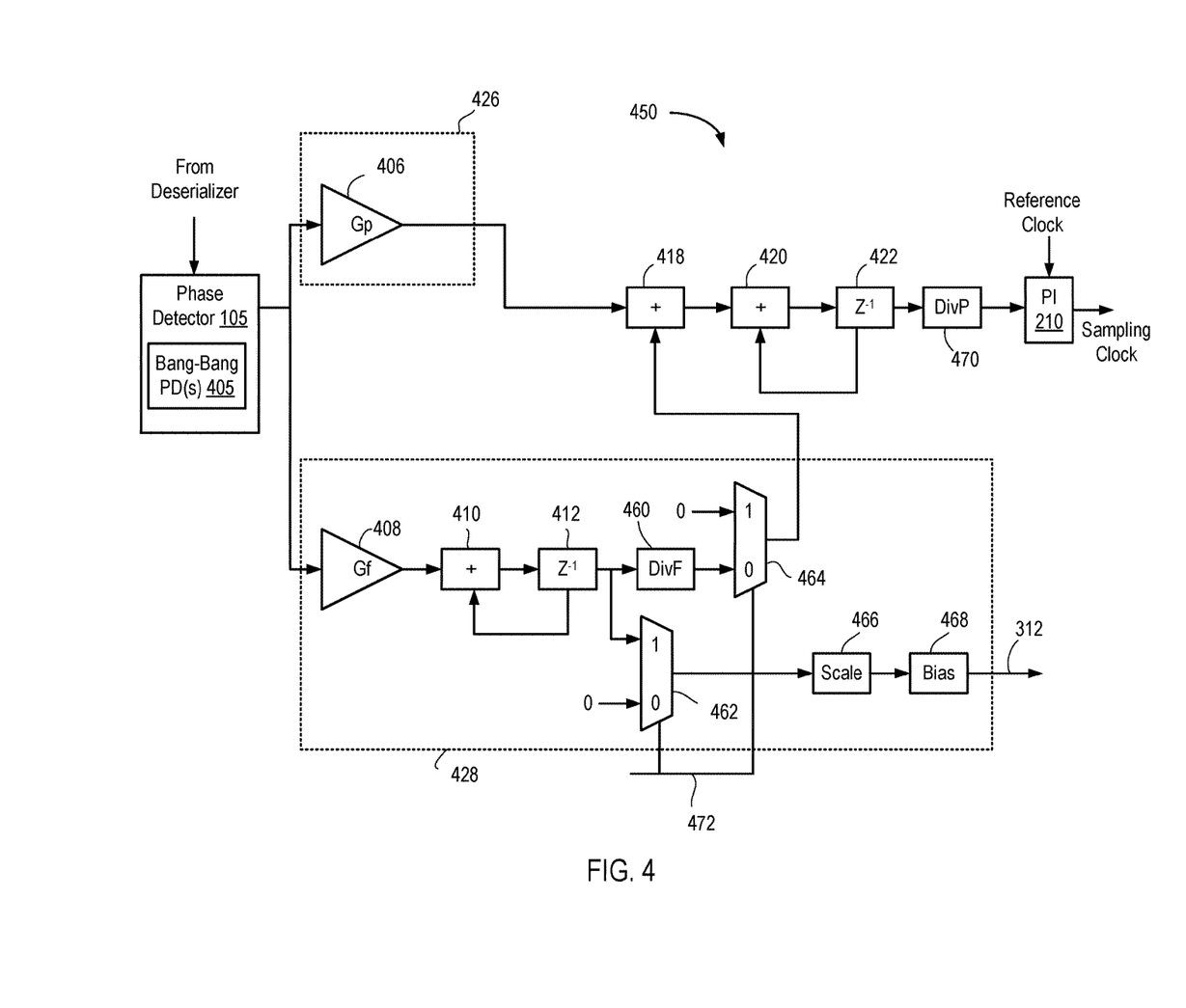
FIG. 4 is a block diagram depicting phase detector and filter circuitry according to an example.

The PD and filter circuitry 209 generates a PI code signal from the deserialized signal generated by the deserializer 208. An example of the PD and filter circuitry 209 is shown in FIG. 4 and described below. The PI 210 receives a reference clock signal from the fractional-N PLL 212. The PI 210 shifts the phase of the reference clock signal based on the PI code signal output by the PD and filter circuitry 209. The PI 210 outputs the phase-shifted reference clock signal as the sampling clock signal. The PD and filter circuitry 209 provide a control signal to the fractional-N PLL 212 for tuning thereof, as discussed further below. An example of fractional-N PLL 212 is shown in FIG. 3 and described below. The control circuit 216 outputs a control signal to the PD and filter circuitry 209. The control circuit 216 controls whether the PD and filter circuitry 209 operates to provide a tuning signal to the fractional-N PLL 212. The control circuit 216 can either enable or disable generation of the tuning signal provided to the fractional-N PLL 212.

The data signal includes the data and error samples output by the sampling circuitry 204. The adaptation circuit 214 generates control signals for the CTLE 203, the AGC circuit 202, and the DFE 205 based on data signal using known algorithms. If the DFE 205 is present, the adaptation circuit 214 generates a control signal for adjusting the taps of the DFE 205 using a known algorithm. The adaptation circuit 214 outputs the data signal to the PCS circuitry 128. The PCS circuitry 128 processes the data signal to recover the transmitted data.

FIG. 3 is a block diagram depicting the fractional-N PLL 212 according to an example. The fractional-N PLL 212 includes a phase-frequency detector 302, a loop filter 304, a voltage controlled oscillator 306, a frequency divider 308, and a delta-sigma modulator 310 (DSM). An input of the PFD 302 receives a clock signal having a reference frequency Fref. An output of the PFD 302 is coupled to an input of the loop filter 304. An output of the loop filter 304 is coupled to an input of the VCO 306. An output of the VCO 306 is coupled to an input of the frequency divider 308. An output of the frequency divider 308 is coupled to an input of the PFD 302 and an input of the DSM 310, respectively. An output of the DSM 310 is coupled to an input of the frequency divider 308. An input of the DSM 310 receives a control signal 312. In an example, the control signal 312 is the tuning signal provided by the PD and filter circuitry 209 discussed above and described further below.

In operation, the PFD 302, loop filter 304, VCO 306, and frequency divider 308 operate to generate a reference clock based on Fref (e.g., some multiple of Fref). The PFD 302 is configured to detect phase and frequency differences between the reference clock and Fref. The PFD 302 outputs a control signal, which is filtered by loop filter 304, for controlling the frequency of VCO 306. The frequency divider 308 divides the frequency of the reference clock for comparison with Fref at the PFD 302. The divisor used by the frequency divider 308 is controlled by the DSM 310. The DSM 310 outputs a control signal to the frequency divider 308 for changing the divisor over time in order to effectively provide a divisor having a integer part and a fractional part. The DSM 310 can be tuned by the PD and filter circuitry 209, as discussed further below.

FIG. 4 is a block diagram depicting the PD and filter circuitry 209 according to an example. The PD and filter circuitry 209 includes the phase detector 105 and a digital loop filter 450. An input of the phase detector 105 is coupled to the output of the deserializer 208. An output of the phase detector 105 is coupled to the digital loop filter 450. An output of the digital loop filter 450 provides a PI code signal, which is coupled to the input of the PI 210. The output of the PI 210 provides the sampling clock signal, as described above. The phase detector 105 includes at least one bang-bang phase detector 405, for example.

In an example, the digital loop filter 450 includes a gain circuit 406, a gain circuit 408, an adder 410, a delay circuit 412, an adder 418, an adder 420, a delay circuit 422, a divider 460 (divF), a multiplexer 462, a multiplexer 464, a scale circuit 466, a bias circuit 468, and a divider 470 (divP). The gain circuit 406 implements a phase path 426. The gain circuit 408, the adder 410, and the delay circuit 412 implement a frequency path 428. Inputs to the gain circuits 406 and 408 are coupled to an output of the phase detector 105. An output of the gain circuit 406 is coupled to an input of the adder 418. An output of the gain circuit 408 is coupled to an input of the adder 410. An output of the adder 410 is coupled to an input of the delay circuit 412. An output of the delay circuit 412 is coupled to another input of the adder 410, to an input of divF 460, and to an input of the multiplexer 462 (the "1" input). An output of divF 460 is coupled to an input of the multiplexer 464 (the "0" input). Another input of the multiplexer 462 (the "0" input) is configured to receive a constant logic '0' signal. Another input of the multiplexer 464 (the "1" input) is configured to receive a constant logic '0' signal. An output of the multiplexer 462 is coupled to an input of the scale circuit 466. An output of the scale circuit 466 is coupled to an input of the bias circuit 468. An output of the bias circuit 468 provides the tuning control signal 312 to the fractional-N PLL. Control inputs of the multiplexers 462 and 464 are coupled to receive a control signal 472 for selecting the "0" or "1" input ports thereof to be passed to their outputs. The control signal 472 can be output from the control circuit 216 (FIG. 2).

An output of the multiplexer 464 is coupled to another input of the adder 418. An output of the adder 418 is coupled to an input of the adder 420. An output of the adder 420 is coupled to an input of the delay circuit 422. An output of the delay circuit 422 is coupled to another input of the adder 420 and to an input of divP 470. An output of divP 470 is coupled to an input of the PI 210.

In operation, consider a case where the control circuit 216 sets the control signal 472 to select the "0" ports of the multiplexers 462 and 464. The phase detector 105 generates a net phase detect result on the data and crossing samples in the deserialized data. The phase detector 105 can include a plurality of bang-bang phase detectors 405 each generating an individual phase detect result based on a pair of data samples and a crossing sample. The bang-bang phase detectors 405 can generate individual phase detect results using different sets of data/crossing samples. The phase detector 105 combines the individual phase detect results to generate the net phase detect result. The phase detector 105 outputs a phase detect result signal having the net phase detect result to the digital loop filter 450.

The digital loop filter 450 performs a CDR algorithm to adjust the PI code based on the phase detect result signal. The gain circuit 406 applies a phase gain (Gp) to the phase detect result signal. For example, the gain circuit 406 can implement a scaling operation to apply the phase gain. The gain circuit 408 applies a frequency gain (Gf) to the phase detect result signal. For example, the gain circuit 408 can implement a scaling operation to apply the frequency gain. The output of the gain circuit 408 is integrated by the adder 410 and the delay circuit 412, the result of which is divided by divF 460 (e.g., a right-shift operation). The integrated output of the frequency path 428 is added to the output of the phase path 426 by the adder 418. The output of the adder 418 is integrated by the adder 420 and the delay circuit 422, the result of which is divided by the divider divP 470 (e.g., a right-shift operation).

In a PI-based CDR circuit, if the receiver is under the condition of independent reference (IR) spread spectrum clocking (SSC) scheme, a high dynamic parts per million (ppm) offset is not uncommon (e.g., 5000 ppm). In a PI-based CDR, if the bus width is 32 bits, the divP 470 divides by 64, and there are 64 PI-steps within one unit interval (UI), then the CDR's ppm resolution of one increment of frequency path will be $(1/divP/64)/bus\_width*(1\times 10^6) = 1/64/64/32*(1\times 10^6) = 7.63$ ppm in this example. In that example, 7.63 ppm corresponds to 655 at the output of divF 460 for the correction of 5000 ppm. Since this 655 will be added back to the phase path and resulting in the PI code change every CDR cycle (e.g., every 32 UIs in the example), the PI code will be changed 655/divP or approximately 10 codes (or steps) every CDR cycle (assuming ppm offset is a constant 5000 ppm). Even though it is known the SSC ppm will be ramped to 5000 ppm maximum and stay around that range only for a period of time, 10 PI-step (code change every CDR cycle) will be present for the same period of time. In some cases, the PI step change should be limited and not exceed a certain number of codes (e.g., less than 10 PI steps).

The architecture shown in FIG. 4 is provided to resolve the issue of PI step change exceeding specifications of the PI 210. In an example, consider a case where the control circuit 216 sets the control signal 472 to select the "1" ports of the multiplexers 462 and 464. In such case, output of the delay circuit 412 is provided to the scale circuit 466. Likewise, a constant '0' is applied to the second input of the adder 418. That is, information from the frequency path is not added to the phase path. The scale circuit 466 negates and applies a scaling factor, and the bias circuit 468 adds a constant bias to generate the tuning signal 312. The tuning signal is applied to the DSM 310 to change the fractional part of the total dividing ratio and thus result in the frequency change of the fractional-N PLL 212. This results in a reduction in the maximum change in PI codes between CDR cycles. That is, the architecture uses frequency path information in the PD and filter circuitry 209 as a controlling signal for the DSM 310. All control is in the digital domain without complications due to signal domain crossing.

Figure 5:
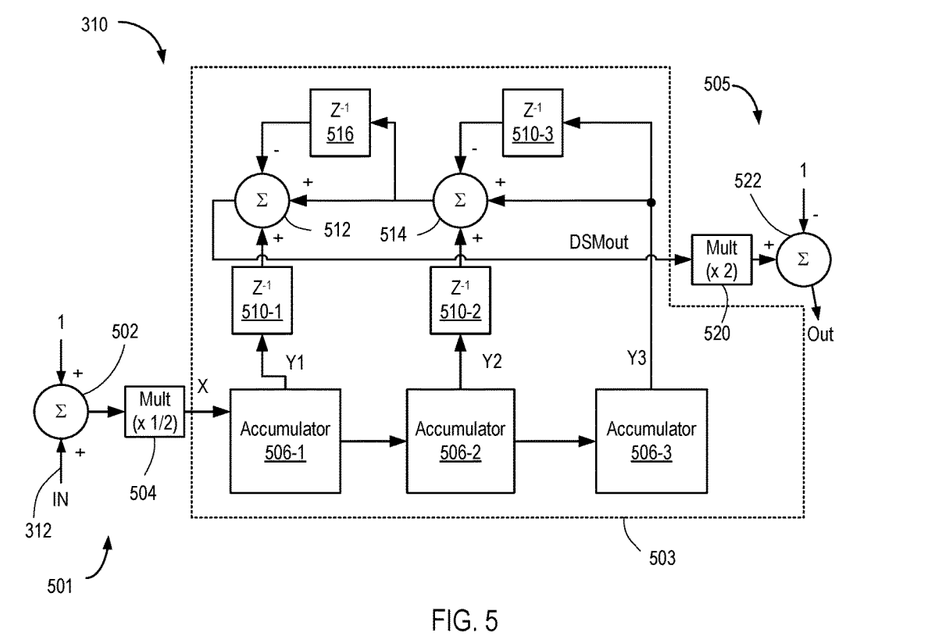
FIG. 5 is a block diagram depicting a delta sigma modulator (DSM) according to an example.
Figure 7:
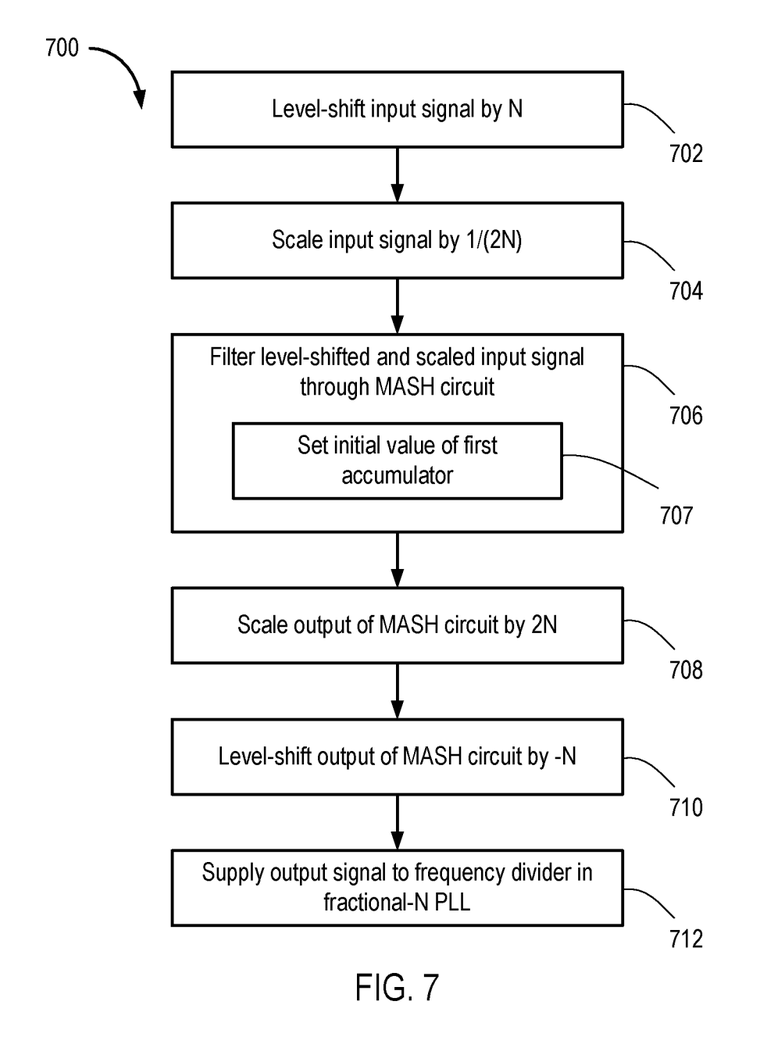
FIG. 7 is a flow diagram depicting a method of operation of the DSM of FIG. 5 according to an example.

FIG. 5 is a block diagram depicting the DSM 310 according to an example. FIG. 7 is a flow diagram depicting a method 700 of operation of the DSM 310 of FIG. 5 according to an example. The DSM 310 includes an input circuit 501, a multi-stage noise shaping (MASH) circuit 503, and an output circuit 505. The input circuit 501 includes an adder 502 and a multiplier 504. The output circuit 505 includes a multiplier 520 and an adder 522. In the example, a first input of the adder 502 receives a constant '1' value, and a second input of the adder 502 is coupled to the control input 312 (designated IN). An output of the adder 502 is coupled to an input of the multiplier 504. An output of the multiplier 504 is coupled to an input of the MASH circuit 503. The multiplier 504 is configured to multiply the output of the adder 502 by a factor of ½ (one-half). An output of the MASH circuit 503 is coupled to an input of the multiplier 520. An output of the multiplier 520 is coupled to a first input of the adder 522 (the "+" input). A second input of the adder 522 receives a constant "1" value (the "−" input). The adder 522 is configured to subtract the constant "1" value from the output of the multiplier 520. The multiplier 520 is configured to multiply the output of the MASH circuit 503 by a factor of two (2). An output of the adder 522 provides an output of the DSM 310 (e.g., coupled to the frequency divider 308).

The MASH circuit 503 includes accumulators 506-1 through 506-3 (accumulators 506), delay circuits 510-1 through 510-3 (delay circuits 510), an adder 512, an adder 514, and a delay circuit 516. An input of the accumulator 506-1 is coupled to the output of the multiplier 504 (designated X). A first output of the accumulator 506-1 is coupled to an input of the accumulator 506-2. A first output of the accumulator 506-2 is coupled to an input of the accumulator 506-3.

A second output of the accumulator 506-1 (designated Y1) is coupled to an input of the delay circuit 510-2. A second output of the accumulator 506-2 (designated Y2) is coupled to an input of the delay circuit 510-2. An output of the accumulator 506-3 (designated Y3) is coupled to an input of the delay circuit 510-3. The output of the accumulator 506-3 is also coupled to an input of the adder 514 (a "+" input). An output of the delay circuit 510-1 is coupled to an input of the adder 512 (a "+" input). An output of the delay circuit 510-2 is coupled to an input of the adder 514 (a "+" input). An output of the delay circuit 510-3 is coupled to an input of the adder 514 (a "−" input). An output of the adder 514 is coupled to an input of the delay circuit 516 and an input of the adder 512 (a "+" input). An output of the delay circuit 516 is coupled to an input of the adder 512 (a "−" input). An output of the adder 512 is coupled to the input of the multiplier 520.

In operation, the input data of the control signal 312 is ranged from −1 to 1-LSB (where LSB denotes a value represented by a "least significant bit" of the digital signal). In the example of FIG. 5, N=1. In an example, the control signal 312 is a fixed-point digital signal. The adder 502 level-shifts (702) the input to range between 0 and 2-LSB. The multiplier 504 scales (704) the output of the adder 502 by ½. The output of the multiplier 504 ranges between 0 and 1-LSB, which is provided as input to the MASH circuit 503. That is, X is a value between 0 and 1-LSB. The signal X is filtered (706) by the MASH circuit 503. The initial value of the accumulator 506-1 is set (707) to $2^{-accum\_size}$, where accum_size is the bitwidth of the accumulator 506-1. The initial values of the accumulators 506-2 and 506-3 are both set to zero. The output of the MASH circuit 503 is then scaled (708) by a factor of 2 at the multiplier 520 and level-shifted (710) by the adder 522. That is, the output circuit 505 performs the inverse operation of the input circuit 501. In other words, the input circuit 501 shifts by one and scales by ½, while the output circuit 505 scales by 2 and shifts by −1. The output of the adder 522 is provided (710) to the frequency divider 308 in the fractional-N PLL 212.

The outputs Y1 through Y3 of the accumulators 506-1 through 506-3, respectively, are carry bit outputs (i.e., overflow bit outputs). The accumulators 506-1 through 506-3 output accumulated values to the delay circuits 510-1 through 510-3, respectively. In the example, the MASH circuit 503 is a third order filter (1-1-1). The accumulator 506-1 adds the output (X) of the multiplier 504 to its accumulated value. The accumulator 506-2 adds the delayed output of the accumulator 506-1 to its accumulated value. The accumulator 506-3 adds the delayed output of the accumulator 506-2 to its accumulated value. The adder 514 adds the delayed carry bit from the accumulator 506-2 with the carry bit from the accumulator 506-3 and subtracts a delayed carry bit from the accumulator 506-3. The adder 512 adds the output of the adder 514 with a delayed carry bit from the accumulator 506-1 and subtracts a delayed output of the adder 514. The output of the adder 512 is provided to the multiplier 520.

The output of the MASH circuit 503 (designated DSMout) ranges between −3 and 4 over time (e.g., over a plurality of clock cycles). However, the average value of DSMout is X (i.e., the input of the MASH circuit 503). In this manner, the MASH circuit 503 still operates with an input between 0 and 1-LSB. However, the DSM 310 operates with an input range between −1 to 1-LSB (e.g., a range nearly centered around zero). This allows the DSM 310 to provide a fractional divider that either adds to or subtracts from an integer divider. For example, to provide a divider of 50.01, the DSM 310 can output 0.01 to be added to an integer divider of 50. If the divider is changed to 49.99, the DSM 310 can output −0.01 to be added to the integer divider of 50. In such case, the output of the DSM 310 travels only between 0.01 and −0.01, rather than its full range.

In the example of FIG. 5, the input range is −1 to 1-LSB. However, in other embodiments, the input circuit 501 and the output circuit 505 can be configured to implement a −N to N-LSB range. Further, the implementation of the DSM 310 shown in FIG. 5 can result in missing a few integers at the output. This problem can be addressed using the implementation of the DSM 310 shown in FIG. 6 at the cost of increased circuit area and power consumption.

Figure 6:
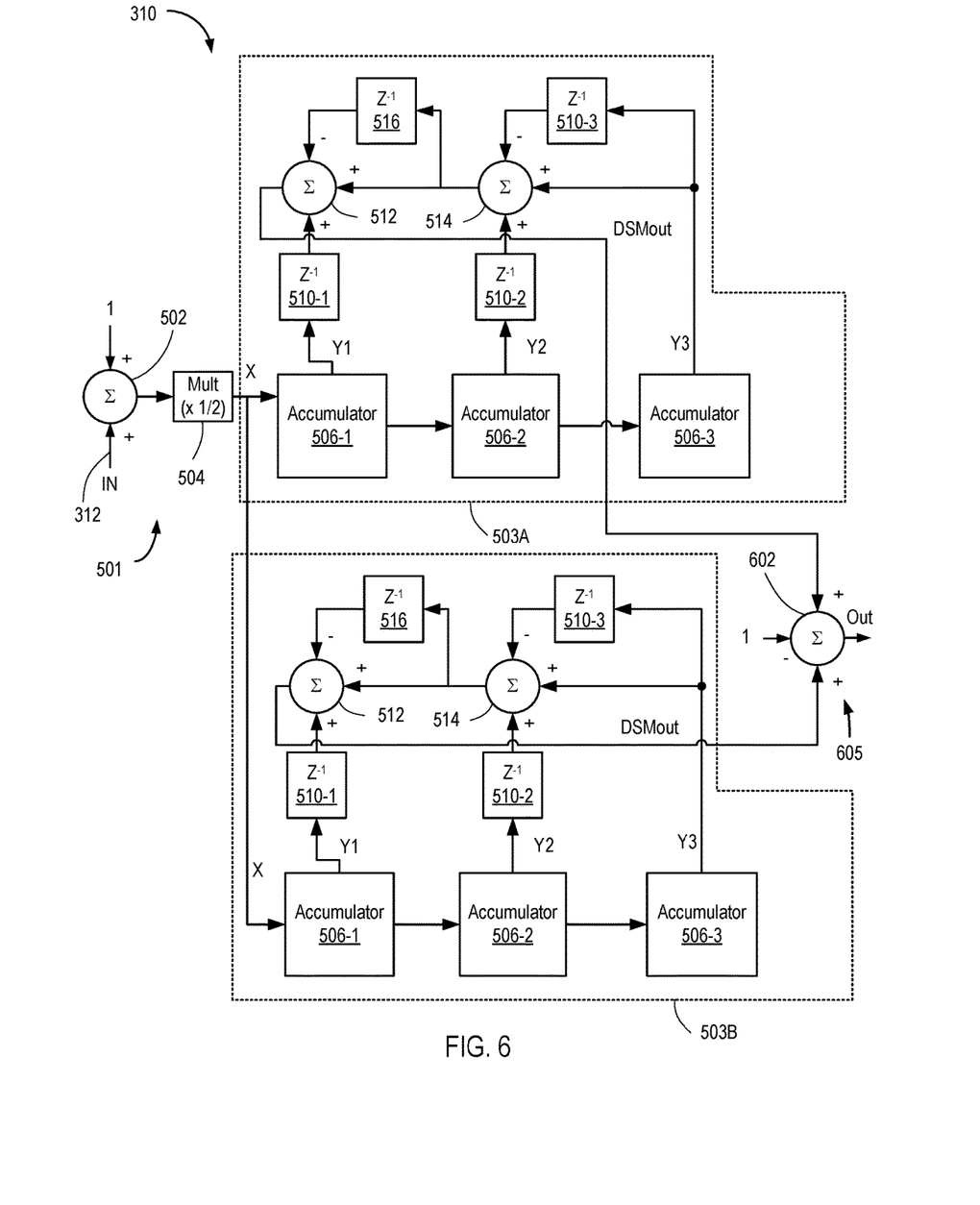
FIG. 6 is a block diagram depicting a DSM according to another example.
Figure 8:
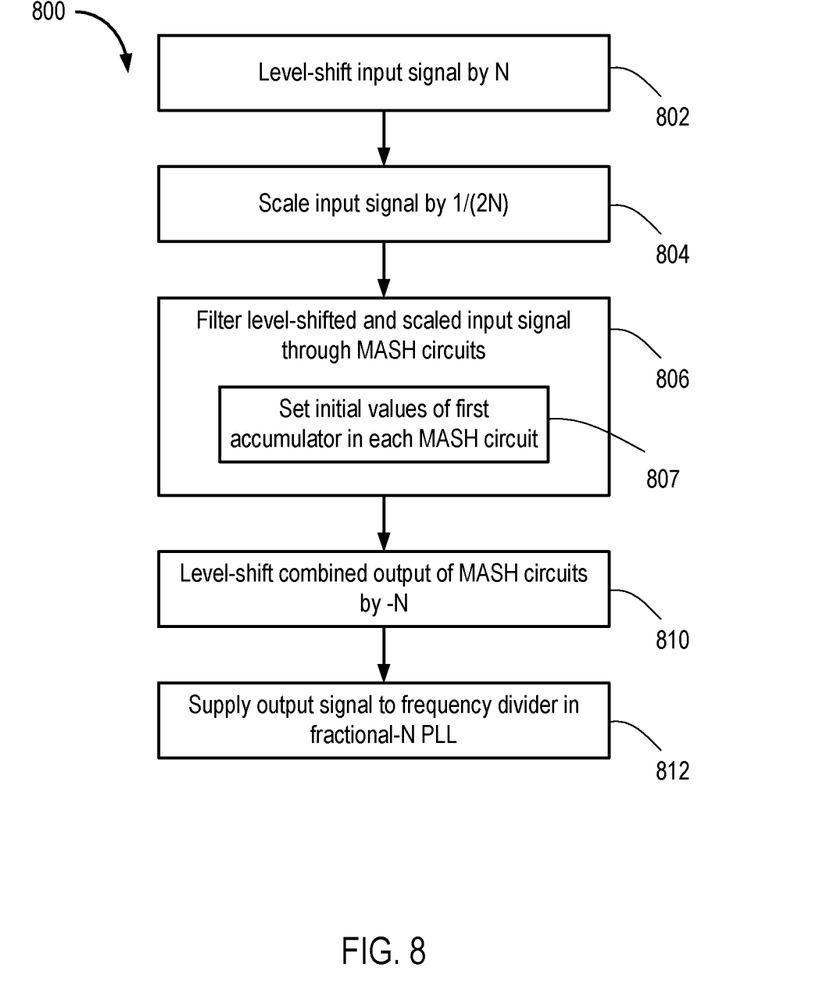
FIG. 8 is a flow diagram depicting a method of operation of the DSM of FIG. 6 according to an example.

FIG. 6 is a block diagram depicting the DSM 310 according to another example. FIG. 8 is a flow diagram depicting a method 800 of operation of the DSM 310 of FIG. 6 according to an example. In the example of FIG. 6, the DSM 310 includes two instances of the MASH circuit 503, designated MASH circuit 503A and MASH circuit 503B. The output of the multiplier 504 is coupled to the input of the accumulator 506-1 in each of the MASH circuits 503A and 503B. The output circuit 505 is replaced with an output circuit 605, which includes an adder 602. An output of the adder 512 in the MASH circuit 503A is coupled to one input of the adder 602 (a "+" input), an output of the adder 512 in the MASH circuit 503B is coupled to another input of the adder 602 (a "+" input), and a third input of the adder 602 is configured to receive a constant "1" value (a "−" input).

In the example, it is assumed N=1. In operation, the input data of the control signal 312 is ranged from −1 to 1-LSB, similar to the example in FIG. 5 above. The adder 502 level-shifts (802) the input to range between 0 and 2-LSB. The multiplier 504 scales (804) the output of the adder 502 by ½. The output of the multiplier 504 ranges between 0 and 1-LSB, which is provided as input to the MASH circuits 503A and 503B. That is, X is a value between 0 and 1-LSB. The initial value of the accumulator 506-1 in the MASH circuit 503A is set (807) to $1*2^{-accum\_size}$, where accum_size is the bitwidth of the accumulator 506-1 in the MASH circuit 503A. The initial values of the accumulators 506-2 and 506-3 in the MASH circuit 503A are both set to zero. The initial value of the accumulator 506-1 in the MASH circuit 503B is set (807) to $3*2^{-accum\_size}$, where accum_size is the bitwidth of the accumulator 506-1 in the MASH circuit 503B. The initial values of the accumulators 506-2 and 506-3 in the MASH circuit 503B are both set to zero. The outputs of the MASH circuits 503A and 503B are added and level-shifted (810) by the adder 602. That is, the output circuit 605 performs the inverse operation of the input circuit 501. The output of the adder 602 is provided (810) to the frequency divider 308 in the fractional-N PLL 212.

The advantage of the implementation shown in FIG. 6 is there are no missing integers in the output of the DSM 310. Thus, if a smaller error is required, the implementation of FIG. 6 can be used in place of the implementation of FIG. 5 at the cost of increased circuit area and power consumption. In the example of FIG. 6, the input range is −1 to 1-LSB. However, in other embodiments, the input circuit 501 and the output circuit 605 can be configured to implement a −N to N-LSB range.

Figure 9:
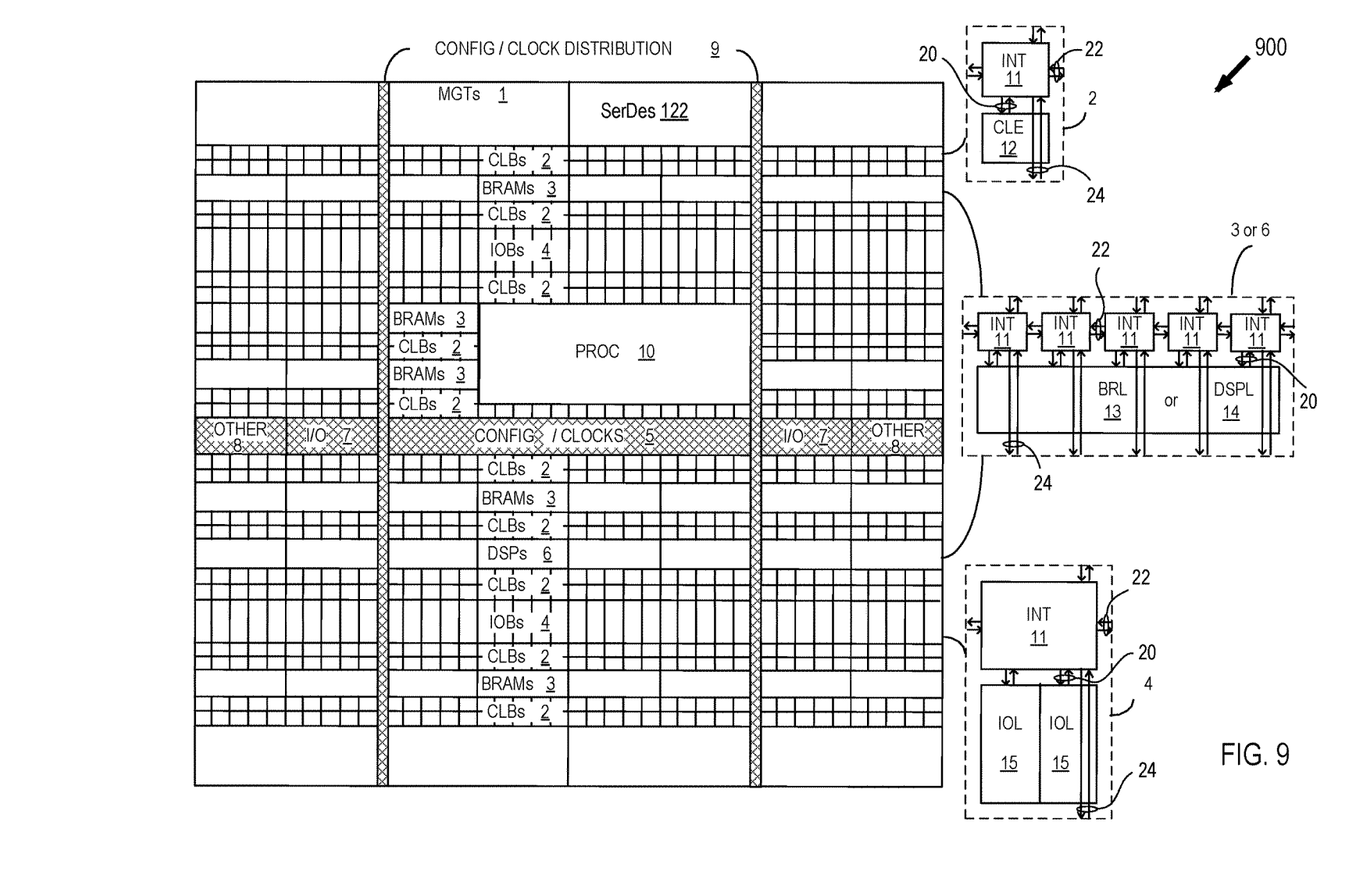
FIG. 9 illustrates an architecture of a field programmable gate array in which DSM implementations described herein can be used.

The SerDes 122 described above can be implemented within an integrated circuit, such as a field programmable gate array (FPGA) or like type programmable circuit. FIG. 9 illustrates an architecture of FPGA 900 that includes a large number of different programmable tiles including multi-gigabit transceivers ("MGTs") 1, configurable logic blocks ("CLBs") 2, random access memory blocks ("BRAMs") input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 600 can include one or more instances of SerDes 122 described above.

In some FPGAs, each programmable tile can include at least one programmable interconnect element ("INT") 11 having connections to input and output terminals 20 of a programmable logic element within the same tile, as shown by examples included at the top of FIG. 1. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 6) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. An apparatus, comprising:
an input circuit including a first adder and a first multiplier, the first adder configured to level-shift an input signal by an amount and the first multiplier configured to multiply an output of the adder by a factor;
a multi-stage noise shaping (MASH) circuit having an input coupled to the first multiplier; and
an output circuit including a second multiplier and a second adder, the second multiplier configured to multiply an output of the MASH circuit by a reciprocal of the factor and the second adder configured to level-shift an output of the second multiplier by an inverse of the amount.

2. The apparatus of claim 1, wherein the input signal is a digital signal representing values between –N and N-LSB, where LSB is a value represented by a least significant bit of the input signal and N is a positive integer.

3. The apparatus of claim 2, wherein N is equal to one, the amount is one, and the factor is one half.

4. The apparatus of claim 3, wherein the MASH circuit includes a plurality of accumulators, and wherein a first accumulator of the plurality of accumulators is configured to be initialized to a value of $1*2^{-accum\_size}$, where accum_size is a bitwidth of the first accumulator.

5. The apparatus of claim 1, further comprising:
a fractional-N phase locked loop (PLL) including a delta sigma modulator (DSM), the DSM having the input circuit, the MASH circuit, and the output circuit, the fractional-N PLL configured to supply a clock signal.

6. The apparatus of claim 5, further comprising:
a phase interpolator configured to receive the clock signal from the fractional-N PLL;
a phase detector configured to generate a phase detect result signal in response to phase detection of data samples and crossing samples of a received signal, the data samples and the crossing samples being generated based on a data phase and a crossing phase, respectively, of a sampling clock supplied by the phase interpolator; and
a digital loop filter configured to generate a phase interpolator code for controlling the phase interpolator, the digital loop filter including a phase path and a frequency path.

7. The apparatus of claim 6, further comprising:
a control circuit configured to control the digital loop filter to disconnect the frequency path from the phase path and to connect the frequency path to a control input of the fractional-N PLL.

8. An apparatus, comprising:
an input circuit including a first adder and a first multiplier, the first adder configured to level-shift an input signal by an amount and the first multiplier configured to multiply an output of the adder by a factor;
a plurality of multi-stage noise shaping (MASH) circuits each having an input coupled to the first multiplier; and
an output circuit having a second adder, the second adder configured to level-shift a combined output of the plurality of MASH circuits by an inverse of the amount.

9. The apparatus of claim 8, wherein the input signal is a digital signal representing values between –N and N-LSB, where LSB is a value represented by a least significant bit of the input signal and N is a positive integer.

10. The apparatus of claim 8, wherein N is equal to one, the amount is one, the factor is one half, and the plurality of MASH circuits is two MASH circuits.

11. The apparatus of claim 10, wherein a first MASH circuit includes a first plurality of accumulators, and wherein a first accumulator of the first plurality of accumulators is configured to be initialized to a value of $1*2^{-accum\_size}$, where accum_size is a bitwidth of the first accumulator, and wherein a second MASH circuit includes a second plurality of accumulators, and wherein a first accumulator of the second plurality of accumulators is configured to be initialized to a value of $3*2^{-accum\_size}$.

12. The apparatus of claim 8, further comprising:
a fractional-N phase locked loop (PLL) including a delta sigma modulator (DSM), the DSM having the input circuit, the plurality of MASH circuits, and the output circuit, the fractional-N PLL configured to supply a clock signal.

13. The apparatus of claim 12, further comprising:
a phase interpolator configured to receive the clock signal from the fractional-N PLL; and
a phase detector configured to generate a phase detect result signal in response to phase detection of data samples and crossing samples of a received signal, the data samples and the crossing samples being generated based on a data phase and a crossing phase, respectively, of a sampling clock supplied by the phase interpolator.

14. The apparatus of claim 13, further comprising:
a digital loop filter configured to generate a phase interpolator code for controlling the phase interpolator, the digital loop filter including a phase path and a frequency path.

15. The apparatus of claim 14, further comprising:
a control circuit configured to control the digital loop filter to disconnect the frequency path from the phase path and to connect the frequency path to a control input of the fractional-N PLL.

16. A method of operating a delta-sigma modulator (DSM), comprising:
level-shifting, by a first adder in an input circuit, an input signal by an amount;
scaling, by a first multiplier in the input circuit, an output of the first adder by a factor;
filtering an output of the first multiplier through a multi-stage noise shaping (MASH) circuit;
scaling, by a second multiplier in an output circuit, an output of the MASH circuit by a reciprocal of the factor; and
level-shifting, by a second adder in the output circuit, an output of the second multiplier by an inverse of the amount.

17. The method of claim 16, wherein the input signal is a digital signal representing values between −N and N-LSB, where LSB is a value represented by a least significant bit of the input signal and N is a positive integer.

18. The method of claim 17, wherein N is equal to one, the amount is one, and the factor is one half.

19. The method of claim 16, wherein the MASH circuit includes a plurality of accumulators, and wherein a first accumulator of the plurality of accumulators is configured to be initialized to a value of $1*2^{-accum\_size}$, where accum_size is a bitwidth of the first accumulator.

20. The method of claim 16, further comprising:
   supplying an output of the second adder to a frequency divider in a fractional-N phase locked loop (PLL) circuit.

* * * * *